(12) United States Patent
Gupta et al.

(10) Patent No.: US 10,043,875 B2
(45) Date of Patent: Aug. 7, 2018

(54) SPATIALLY DECOUPLED FLOATING GATE SEMICONDUCTOR DEVICE

(71) Applicant: INTERNATIONAL BUSINESS MACHINES CORPORATION, Armonk, NY (US)

(72) Inventors: Suyog Gupta, White Plains, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/862,738

(22) Filed: Jan. 5, 2018

(65) Prior Publication Data
US 2018/0130892 A1    May 10, 2018

Related U.S. Application Data

(63) Continuation of application No. 15/175,114, filed on Jun. 7, 2016, now Pat. No. 9,899,485.

(51) Int. Cl.
*H01L 29/423* (2006.01)
*H01L 29/41* (2006.01)
(Continued)

(52) U.S. Cl.
CPC .. *H01L 29/42324* (2013.01); *H01L 21/28273* (2013.01); *H01L 21/3215* (2013.01);
(Continued)

(58) Field of Classification Search
CPC .......... H01L 29/42324; H01L 28/7833; H01L 28/66825; H01L 28/51; H01L 28/413; H01L 21/28273; H01L 21/3215
See application file for complete search history.

(56) References Cited

U.S. PATENT DOCUMENTS 4,958,321 A * 9/1990 Chang ................ G11C 16/0416
                                                    257/E29.306
5,777,359 A   7/1998 Ra
(Continued)

FOREIGN PATENT DOCUMENTS

JP      2007250724 A      9/2007

OTHER PUBLICATIONS

Wu et al., "SONOS Device With Tapered Bandgap Nitride Layer", IEEE Transactions on Electron Devices, vol. 52, No. 5, May 2005, pp. 987-992.

(Continued)

*Primary Examiner* — Benjamin Sandvik
*Assistant Examiner* — Farid Khan
(74) *Attorney, Agent, or Firm* — L. Jeffrey Kelly

(57) ABSTRACT

A method includes forming a tunneling dielectric layer on a semiconductor substrate, a first portion of the tunneling dielectric layer is directly above a channel region in the semiconductor substrate and a second portion of the tunneling dielectric layer is directly above source-drain regions located on opposing sides of the channel region, the second portion of the tunneling dielectric layer is thicker than the first portion of the tunneling dielectric layer, forming a floating gate directly above the first portion of the tunneling dielectric layer and the second portion of the tunneling dielectric layer, and forming a control dielectric layer directly above the floating gate.

20 Claims, 6 Drawing Sheets

(51) Int. Cl.
*H01L 29/51* (2006.01)
*H01L 21/3215* (2006.01)
*H01L 21/28* (2006.01)
*H01L 29/66* (2006.01)
*H01L 29/788* (2006.01)

(52) U.S. Cl.
CPC ............ *H01L 29/413* (2013.01); *H01L 29/51* (2013.01); *H01L 29/66825* (2013.01); *H01L 29/7883* (2013.01); *H01L 29/4238* (2013.01); *H01L 29/42368* (2013.01)

(56) References Cited

U.S. PATENT DOCUMENTS

| | | | |
|---|---|---|---|
| 5,897,354 A * | 4/1999 | Kachelmeier | H01L 29/42324 257/E21.422 |
| 7,675,106 B2 | 3/2010 | Bouchakour et al. | |
| 7,705,395 B2 | 4/2010 | Park et al. | |
| 8,101,989 B2 | 1/2012 | Lue | |
| 8,659,071 B2 | 2/2014 | Tian | |
| 8,962,402 B1 | 2/2015 | Sharma et al. | |
| 8,981,459 B2 | 3/2015 | Yan et al. | |
| 9,147,690 B2 | 9/2015 | Chen et al. | |
| 2005/0072989 A1* | 4/2005 | Bawendi | B82Y 10/00 257/200 |
| 2006/0261401 A1* | 11/2006 | Bhattacharyya | B82Y 10/00 257/316 |
| 2008/0116506 A1* | 5/2008 | Lue | H01L 21/28273 257/324 |
| 2009/0173991 A1* | 7/2009 | Marsh | B22F 9/12 257/324 |
| 2009/0262583 A1* | 10/2009 | Lue | G11C 16/0408 365/185.28 |
| 2010/0258851 A1* | 10/2010 | Liu | H01L 21/28273 257/316 |
| 2011/0199830 A1 | 8/2011 | Lee et al. | |
| 2012/0228693 A1 | 9/2012 | Thomas | |
| 2013/0168755 A1* | 7/2013 | Kim | G11C 16/0441 257/315 |
| 2014/0131716 A1* | 5/2014 | Shieh | H01L 21/28273 257/66 |
| 2014/0131726 A1 | 5/2014 | Lee et al. | |
| 2015/0035039 A1 | 2/2015 | Li et al. | |
| 2017/0352734 A1 | 12/2017 | Gupta et al. | |

OTHER PUBLICATIONS

IBM: List of IBM Patents or Patent Applications Treated as Related (Appendix P), Feb. 6, 2018, 2 pages.
Pending U.S. Appl. No. 15/862,742, filed Jan. 5, 2018, entitled: "Spatially Decoupled Floating Gate Semiconductor Device", 27 pages.

* cited by examiner

SPATIALLY DECOUPLED FLOATING GATE SEMICONDUCTOR DEVICE

BACKGROUND

The present invention generally relates to semiconductor devices, and more particularly to floating gate semiconductor devices, such as non-volatile memory devices, having increased charge retention capabilities and faster program/erase cycles.

Non-volatile memory (NVM) devices, are used in various types of computer memory, for example, flash memory devices. NVM devices are typically formed using either bipolar or metal-oxide semiconductor (MOS) technologies. An NVM device generally includes a floating gate separated from a control gate by a gate oxide layer. The floating gate is adapted for receiving electrons during a program cycle. A plurality of secondary devices, including the control gate, may be formed above the floating gate and be electrically isolated from it. Since the floating gate may be surrounded in its entirety by a highly resistive material, the charge contained in the floating gate may remain unchanged for extended periods of time.

SUMMARY

According to an embodiment of the present disclosure, a method may include forming a tunneling dielectric layer on a semiconductor substrate, a first portion of the tunneling dielectric layer is directly above a channel region in the semiconductor substrate and a second portion of the tunneling dielectric layer is directly above source-drain regions located on opposing sides of the channel region, the second portion of the tunneling dielectric layer is thicker than the first portion of the tunneling dielectric layer, forming a floating gate directly above the first portion of the tunneling dielectric layer and the second portion of the tunneling dielectric layer, and forming a control dielectric layer directly above the floating gate.

According to another embodiment of the present disclosure, a method may include providing a semiconductor substrate including source-drain regions on opposite sides of a channel region, forming a tunneling dielectric layer on the semiconductor substrate, a first portion of the tunneling dielectric layer is directly above the channel region and a second portion of the tunneling dielectric layer is directly above the source-drain regions, the second portion of the tunneling dielectric layer is thicker than the first portion of the tunneling dielectric layer, forming a plurality of nanostructures in the second portion of the tunneling dielectric layer, forming a floating gate directly above the first portion of the tunneling dielectric layer and the second portion of the tunneling dielectric layer, the plurality of nanostructures create one or more electronic trap states within an energy bandgap of the floating gate, and forming a control dielectric layer directly above the floating gate.

According to another embodiment of the present disclosure, a structure may include: a semiconductor substrate including source-drain regions on opposite sides of a channel region, a tunneling dielectric layer on the semiconductor substrate, a first portion of the tunneling dielectric layer is directly above the channel region and a second portion of the tunneling dielectric layer is directly above the source-drain regions, the second portion of the tunneling dielectric layer is thicker than the first portion of the tunneling dielectric layer, a floating gate directly above the first portion of the tunneling dielectric layer and the second portion of the tunneling dielectric layer, a first portion of the floating gate directly above the first portion of the tunneling dielectric layer includes a program/erase region of the floating gate and a second portion of the floating gate directly above the second portion of the tunneling dielectric layer includes a charge retention region of the floating gate, a second dielectric layer directly above the floating gate, and a control gate directly above the control dielectric layer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
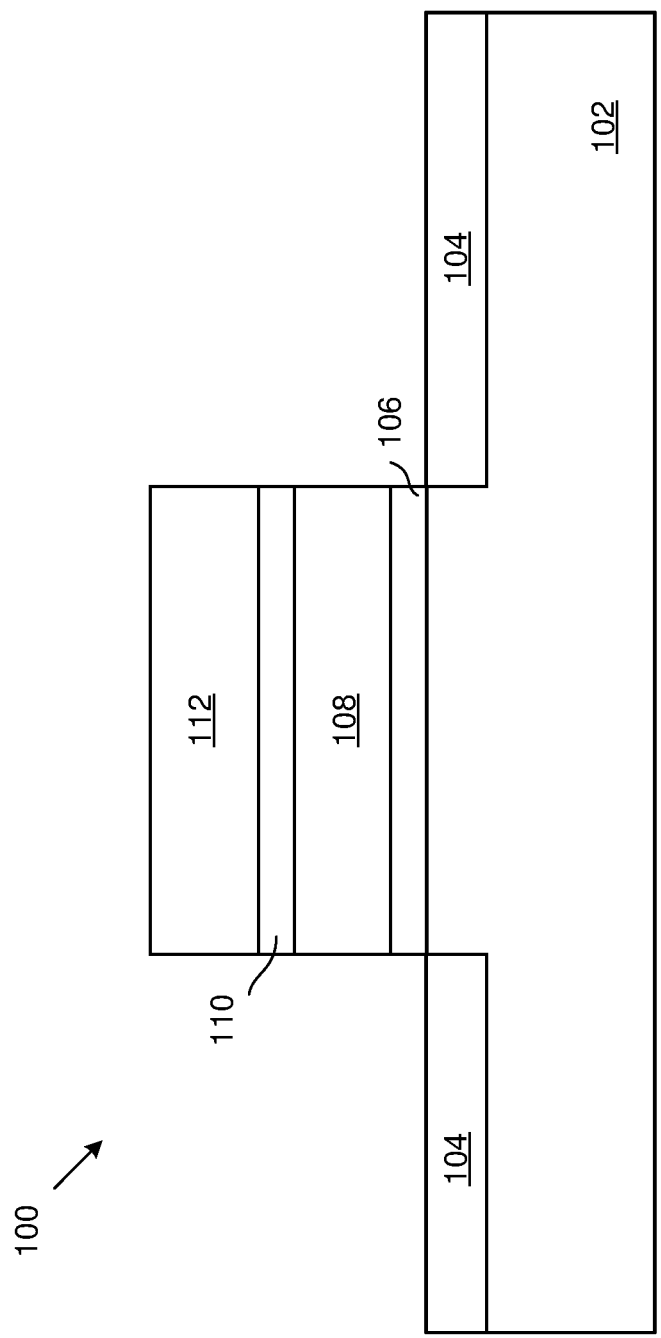
FIG. 1 is a cross-sectional view of a typical floating gate semiconductor device, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Complementary metal-oxide semiconductor (CMOS) technology has focused on high dielectric constant (high-k) materials as possible gate dielectrics to accommodate for the continued miniaturization of integrated circuits without loss of performance and reliability. Particularly, in non-volatile memory (NVM) technologies, high-k dielectric materials are employed to achieve memory devices with larger charge retention capabilities and faster program/erase (P/E) cycles.

NVM devices, such as flash memory devices, store data by accumulation of electric charge on a floating gate generally positioned above a gate dielectric (also known as "tunnel oxide", "tunneling dielectric" or "high-k tunneling dielectric").

Typically, in order to accelerate the P/E cycle (e.g. lower P/E voltage), a thickness of the gate dielectric is substantially reduced. As a result, the charge retention capabilities of the floating gate are drastically reduced in NVM devices. Additionally, the use of high-k dielectric materials reduces the bandgap difference between the gate dielectric and the floating gate. This reduced bandgap difference may lead to high current leakage and degraded charge retention time in traditional NVM devices.

Therefore, by spatially decoupling the P/E and charge retention mechanisms of a floating gate semiconductor device and controlling the bandgap difference between the gate dielectric and the floating gate in the charge retention region, embodiments of the present disclosure may, among other potential benefits, accelerate the P/E cycle while improving the charge retention capabilities of floating gate semiconductor devices.

The present invention generally relates to semiconductor devices, and more particularly to floating gate semiconductor devices, such as NVM devices, having increased charge retention capabilities and faster program/erase cycles. One way to form a floating gate semiconductor device having increased charge retention capabilities and faster P/E cycles may include spatially decoupling the P/E and charge retention regions of the floating gate semiconductor device. One embodiment by which separation of the P/E and charge retention regions of the floating gate semiconductor device may be performed is described in detailed below by referring to the accompanying drawings in FIGS. 1-5.

Referring now to FIG. 1, a cross-sectional view of a semiconductor device 100 is shown, according to an embodiment of the present disclosure. In this embodiment, the semiconductor device 100 is a non-volatile memory (NVM) device which may include, for example, erasable-programmable read-only memory (EPROM) devices, electrically erasable-programmable read-only memory (EE-PROM) devices, and/or flash memory devices. It should be noted that, in this embodiment, the semiconductor device 100 exhibits a configuration typical of traditional NVM devices.

The semiconductor device 100 may include a floating gate 108 disposed on a substrate 102 between source-drain regions 104, and above a high-k tunneling dielectric layer 106 (hereinafter "tunneling dielectric layer"). The semiconductor device 100 may also include a control dielectric layer 110 and a control gate 112. The control dielectric layer 110 may be directly above the floating gate 108. More specifically, the control dielectric layer 110 may be interposed between the floating gate 108 and the control gate 112.

The substrate 102 may be, for example, a semiconductor-on-insulator (SOI) substrate, where a buried insulator layer (not shown) separates a base substrate (not shown) from a top semiconductor layer (not shown). The components of the semiconductor device 100 may then be formed in or adjacent to the top semiconductor layer. In other embodiments, the substrate 102 may be a bulk semiconductor substrate which may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide.

In some embodiments, the substrate 102 may further include a p-type doped region (not shown) and/or an n-type doped region (not shown). For example, the substrate 102 may include p-type dopants for an n-type metal-oxide-semiconductor (NMOS) transistor or n-type dopants for a p-type metal-oxide-semiconductor (PMOS) transistor. All doping may be implemented by a process such as ion implantation. In other embodiments, the substrate 102 may also include a well structure (not shown) such as a P-well and an N-well structure, which may be fabricated directly onto or within the substrate 102.

Source-drain regions 104 may be formed on the substrate 102 on opposite sides of the floating gate 108. Numerous methods of forming source-drain regions are known in the art, any of which may be used to form the source-drain regions 104. In some embodiments, the source-drain regions 104 may be formed by doping portions of the substrate 102 in a predefined profile and dopant concentration for optimized device performance according to desired applications. In other embodiments, the source-drain regions 104 may be formed by growing epitaxial semiconductor regions adjacent to the substrate 102. In such cases, the epitaxial semiconductor regions may extend above and/or below the top surface of the substrate 102 and may be grown with a specific doping profile or may be doped after epitaxial growth is complete.

The tunneling dielectric layer 106 may be aligned horizontally interposed between the source-drain regions 104. The tunneling dielectric layer 106 may include a high dielectric constant (k) material such as silicon nitride, silicon oxynitride, hafnium oxide, hafnium silicide, hafnium silicon oxide, hafnium silicon oxynitride, zirconium oxide, aluminum oxide, hafnium dioxide-alumina ($HfO_2$—$Al_2O_3$) alloy, tantalum oxide, and/or combinations thereof. In general, the dielectric constant of the tunneling dielectric layer 106 may be greater than 4. It should be noted that, in some embodiments, the tunneling dielectric layer 106 may be a multi-layer structure.

For example, the tunneling dielectric layer 106 may include a thin layer of silicon oxide (not shown) disposed directly on the substrate 102 formed using a thermal oxidation process, and a layer of a high-k dielectric material (overlying the thin layer of silicon oxide) formed by atomic layer deposition (ALD) or another suitable method.

In other embodiments, the thin layer of silicon oxide may be formed between the substrate 102 and the tunneling dielectric layer 106 during ALD deposition of the tunneling dielectric layer 106. The thin layer of silicon oxide (not shown) may have a thickness of approximately less than 1 nm. In traditional NVM devices (e.g. the semiconductor device 100 of FIG. 1), the tunneling dielectric layer 106 may have a thickness varying from approximately 6 nm to approximately 10 nm.

The floating gate 108 may typically include silicon, germanium, carbon, combinations such as SiGe, SiC, and SiGeC, or other suitable materials. In current semiconductor manufacturing technologies, the material and composition of the floating gate 108 may be selected to provide an energy bandgap less than that of silicon (Eg=1.12 eV) in order to increase the bandgap difference between the tunneling dielectric layer 106 and the floating gate 108 as much as possible. The increased bandgap energy difference between the tunneling dielectric layer 106 and the floating gate 108 may prolong the charge retention time of the floating gate 108, as will be described in detail below.

The floating gate 108 may be doped to enhance its conductivity using phosphorus, boron, or other suitable dopants. An exemplary doping dose may vary from approximately $1 \times 10^{18}$ atoms/cm$^2$ to approximately $1 \times 10^{20}$ atoms/cm$^2$. The floating gate 108 may have a thickness greater than 100 Angstrom. In some embodiments, the floating gate 108 may be designed as a strip structure over the tunneling dielectric layer 106 as shown in FIG. 1. In these embodiments, the floating gate 108 may have a gate length substantially similar to that of the tunneling dielectric layer 106 and aligned therewith. The floating gate 108 may be formed by any deposition method known in the art, including, but not limited to atomic layer deposition (ALD), chemical vapor deposition (CVD), or physical vapor deposition (PVD).

Generally, the tunneling dielectric layer 106 and the floating gate 108 may be patterned along with the control dielectric layer 110 (also referred to as "control oxide") and the control gate 112.

The control dielectric layer 110 and the control gate 112 may be formed above the floating gate 108. More specifically, the control dielectric layer 110 may be disposed over the floating gate 108 and interposed between the floating gate 108 and the control gate 112. The control dielectric layer 110 may include, for example, silicon oxide, silicon nitride, silicon oxynitride, and other appropriate dielectric materials including high-k material(s) used in the tunneling dielectric layer 106 described above. The control dielectric layer 110 may be formed using a similar technique to that of the tunneling dielectric layer 106 described above. In one embodiment, the control dielectric layer 110 may have a thickness varying from approximately 8 nm to approximately 15 nm.

In one embodiment, the control gate 112 may include a doped polysilicon. In another embodiment the control gate 112 may include copper, aluminum, tungsten, nickel, cobalt, tantalum, titanium, platinum, erbium, palladium, and/or other conductive materials. The control gate 112 may be formed by any deposition method known in the art, including, for example, PVD, plating, CVD, plasma enhanced CVD (PECVD), high density plasma CVD (HDPCVD), and ALD.

It should be noted that the semiconductor device 100 may also include gate spacers (not shown) formed on opposite sidewalls of the floating gate 108 and control gate 112 by conventional deposition and etching techniques. In various embodiments, the gate spacers may include one or more layers. While the gate spacers are herein described in the plural, the gate spacers may consist of a single spacer surrounding the floating gate 108 and the control gate 112. The gate spacers may be made from an insulator material such as an oxide, nitride, oxynitride, silicon carbon oxynitride, silicon boron oxynitride, low-k dielectric, or any combination thereof. The gate spacers may have a thickness varying from approximately 2 nm to approximately 25 nm. In one embodiment, the gate spacers may include silicon nitride and may be formed by depositing a conformal silicon nitride layer over the floating gate 108 and the control gate 112, and removing unwanted material from the conformal silicon nitride layer using an anisotropic etching process such as, for example, reactive ion etching (RIE) or plasma etching.

As previously described, in current CMOS technologies in order to accelerate the P/E cycle (e.g. lower P/E voltage) of NMV devices, a thickness of the tunneling dielectric layer 106 may be reduced to approximately less than 5 nm. This thinning of the tunneling dielectric layer 106 may, in traditional NVM devices such as the semiconductor device 100 depicted in FIG. 1, cause a drastic decrease in the charge retention capabilities of the floating gate 108.

In order to maintain and/or improve the charge retention capabilities of the floating gate 108 in the semiconductor device 100 while accelerating its P/E cycle, a spatial decouple of the P/E and charge retention mechanisms of the semiconductor device 100 may be performed as will be described in detail below with reference to FIG. 2.

Figure 2:
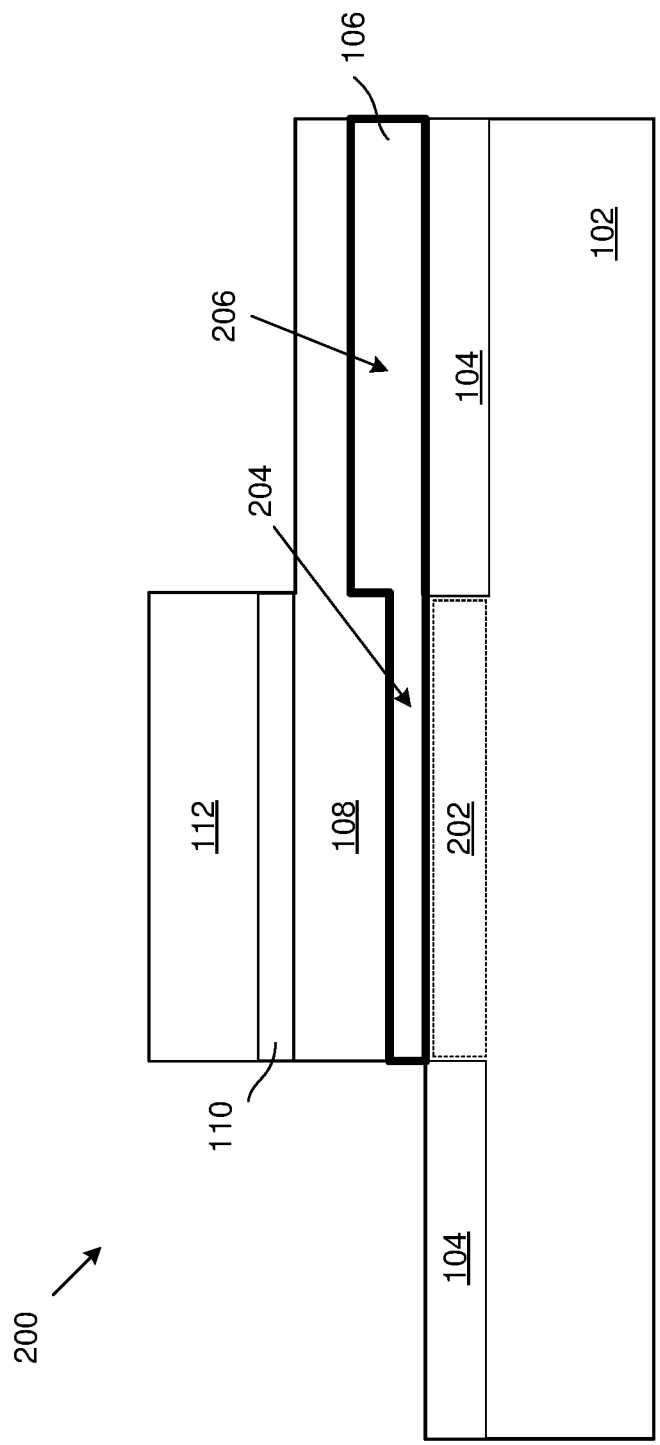
FIG. 2 is a cross-sectional view of a floating gate semiconductor device having spatially decoupled program/erase and charge retention regions, according to an embodiment of the present disclosure.

Referring now to FIG. 2, a cross-sectional view of the semiconductor device 100 depicting an alternate configuration is shown, according to an embodiment of the present disclosure. In this embodiment, the tunneling dielectric layer 106 may have a thin region 204 and a thick region 206. The thin region 204 may extend horizontally over a channel region 202 of the semiconductor device 100, while the thick region 206 may extend horizontally over the source-drain regions 104. It should be noted that, in some embodiments, may occur that the thin region 204 extends over a portion of the source-drain regions 104, or that the thick region 206 extends over a portion of the channel region 202. For illustration purposes only, without intent of limitation, the thick region 206 of the tunneling dielectric layer 106 is shown over only one of the source-drain regions 104.

The tunneling dielectric layer 106 having regions of different thickness, as shown in FIG. 2, may be formed using similar techniques as the ones described above. However, as may be known by those skilled in the art, a multi-deposition multi-etching process may be required to form the thin region 204 and the thick region 206 of the tunneling dielectric layer 106. The thin region 204 of the tunneling dielectric layer 106 may have a thickness varying from approximately 1 nm to approximately 5 nm while the thick region 206 may have a thickness varying from approximately 6 nm to approximately 20 nm.

In one embodiment, the thin region 204 and the thick region 206 of the tunneling dielectric layer 106 may be formed by depositing, on the semiconductor device 100, a first dielectric layer (not shown) having a thickness equal to a difference between the thin region 204 and the thick region 206, and patterning the first dielectric layer to define the thick region 206, a second dielectric layer (not shown) may be subsequently deposited having a thickness equal to that of the thin region 204. It should be noted that the first and second dielectric layers used to form the thin region 204 and the thick region 206 of the tunneling dielectric layer 106 may have the same or different composition and/or material properties.

In another embodiment, the thin region 204 and the thick region 206 of the tunneling dielectric layer 106 may be formed by depositing, on the semiconductor device 100, a first dielectric layer (not shown) having a thickness equal to that of the thin region 204 (or slightly thicker than that of the thin region 204 to account for the subsequent etching of the first dielectric layer during patterning of the thick region 206) followed by a second dielectric layer (not shown) having a thickness equal to that of the thickness difference between the thick region 206 and the thin region 204. As such, the second dielectric layer may have a substantially higher etch rate in a wet or dry etchant compared to that of the first dielectric layer. As known by those skilled in the art, this may be accomplished by either or both of the following: 1) using a different material composition for the second dielectric layer compared to that of the first dielectric layer (e.g. oxide versus high-k), and/or 2) using a dielectric material with a lower density and/or higher structural defects (e.g. with higher hydrogen or other carrier gas content) for the second dielectric layer compared to that of the first dielectric layer. The latter may be achieved by using a lower deposition temperature, lower plasma energy, higher carrier gas content and combinations thereof during the formation of the second dielectric layer compared to those used during formation of the first dielectric layer. Subsequently the second dielectric layer is patterned to form the thick region 206 with no or minimal etching of the first dielectric layer.

Then, the floating gate 108 may be formed above and in direct contact with both the thin region 204 and the thick region 206 of the tunneling dielectric layer 106. The floating gate 108 may be formed following the techniques described above with reference to FIG. 1. Similarly, the control dielectric layer 110 may be formed directly above the floating gate 108 interposed between the floating gate 108 and the control gate 112 as described above. It should be noted that, in some embodiments, the control dielectric layer 110 may be formed directly above an entire length of the floating gate 108, and the control gate 112 may be formed directly above an entire length of the control dielectric layer 110.

In this embodiment, a program/erase (P/E) region of the semiconductor device 100 may include the thin region 204 of the tunneling dielectric layer 106 and a first portion of the floating gate 108 directly above the thin region 204, while a charge retention region of the semiconductor device 100 may include the thick region 206 and a second portion of the floating gate 108 directly above the thick region 206. As such, the P/E region of the semiconductor device 100 may be physically separated or spatially decoupled from the charge retention region in the semiconductor device 100. By decoupling the P/E and charge retention mechanisms of the semiconductor device 100, a substantially thin region 204 may be achieved in the tunneling dielectric layer 106 in order to accelerate the P/E cycles while maintaining or improving the charge retention capabilities of the semiconductor device 100.

Figure 3:
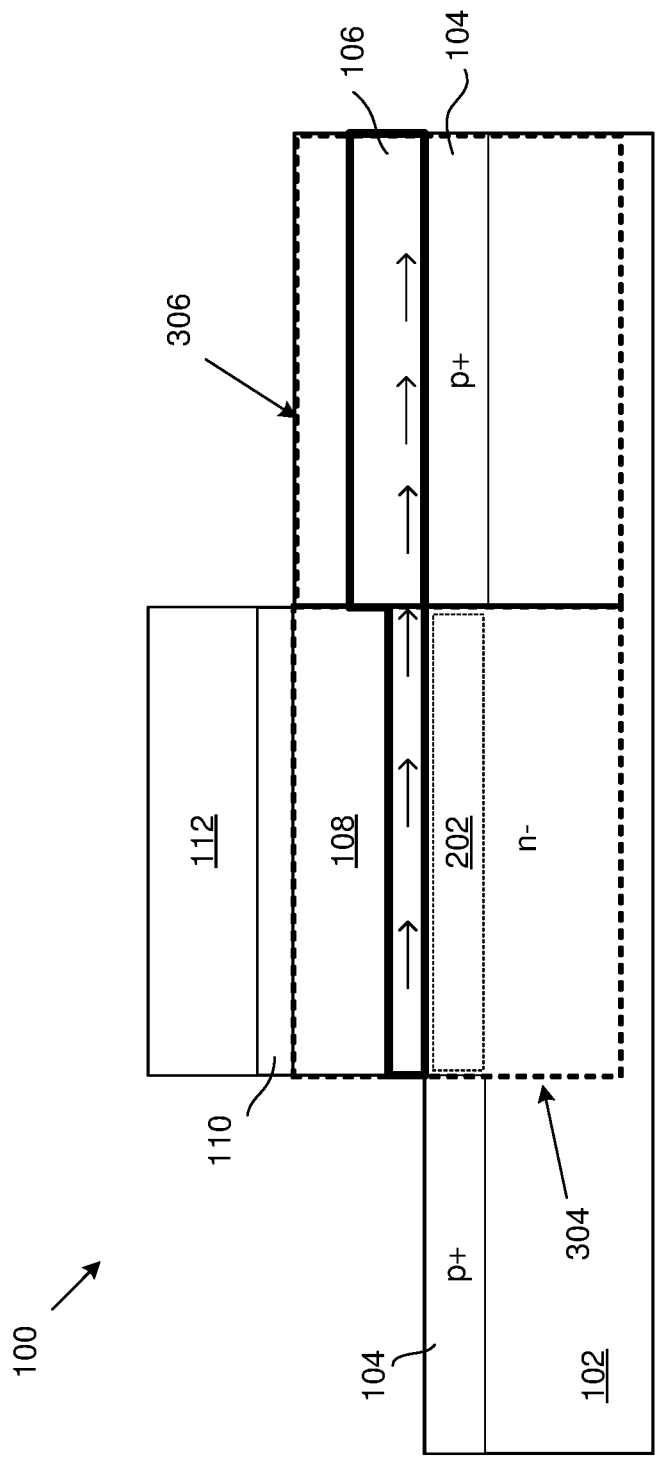
FIG. 3 is a cross-sectional view of a floating gate semiconductor device depicting improved charge movement between program/erase and charge retention regions, according to an embodiment of the present disclosure.

Referring now to FIG. 3, a cross-sectional view of the semiconductor device 100 depicting an improved charge movement between a program/erase (P/E) region 304 and a charge retention region 306 is shown, according to an embodiment of the present disclosure. In the present embodiment, bandgap engineering is used to further improve the charge retention capabilities of the semiconductor device 100. For illustration purposes only, without intent of limitation, in the present embodiment the semiconductor device 100 is a PMOS device.

In one embodiment, increased charge movement between the P/E region 304 and the charge retention region 306 may be achieved by reducing the bandgap of the floating gate 108 in a longitudinal direction (e.g., parallel to the channel region 202) from the P/E region 304 to the charge retention region 306. The bandgap reduction process may be performed in at least one step, but preferably in multiple steps and more preferably in a continuous gradient (i.e. tapered fashion) rather than discrete steps.

Typically, the bandgap of a semiconductor device may be altered by changing its composition. In some instances, the energy bandgap of the floating gate 108 may be reduced by introducing elements exhibiting an energy bandgap lower than that of the floating gate 108 using techniques such as ion implantation. For example, in one embodiment, the bandgap of the floating gate 108 may be reduced by forming the floating gate 108 from silicon, followed by ion-implantation of germanium atoms into the silicon floating gate. As may be known by those skilled in the art, germanium has a lower bandgap than silicon which may help increasing the bandgap difference between the floating gate 108 and the tunneling dielectric layer 106 hence facilitating the transfer of trapped holes from the P/E region 304 of the floating gate 108 to the charge retention region 306.

A tapered or substantially tapered bandgap is preferred over a stepwise reduced bandgap (e.g., abruptly changed) because bandgap discontinuities arising from abrupt changes in bandgap may hamper efficient carrier transport. In one embodiment, for example, a stepwise implanted profile may be achieved by masked ion implantation. In another embodiment, for example, a tapered (or substantially tapered) implanted profile may be obtained by post-implantation annealing to facilitate inter-diffusion and/or intermixing of the implanted element(s).

It should be noted that when a floating gate (e.g., the floating gate 108) has the same bandgap along a longitudinal direction, trapped charge carriers from the channel region and the P/E region of the floating gate may have approximately the same probability of staying in the P/E region or moving to the charge retention region of the floating gate. The charged carriers that move to the charge retention region of the floating gate may have a reduced probability of tunneling back into the channel region due to the thicker tunneling dielectric layer in the charge retention region. However, the charge carriers that remain in the P/E region have a much larger probability of tunneling back into the channel region due to the thinner tunneling dielectric layer in the P/E region. As a result, even though the charge retention time of the semiconductor device 100 in FIG. 2 is improved by having a tunneling dielectric layer of different thicknesses, engineering the bandgap as described above may further improve the movement of trapped charge carriers from the P/E region 304 to the charge retention region 306 of the floating gate 108. Therefore, by engineering the floating gate bandgap, the charge retention time may be further increased in the charge retention region 306 of the floating gate 108.

Figure 4:
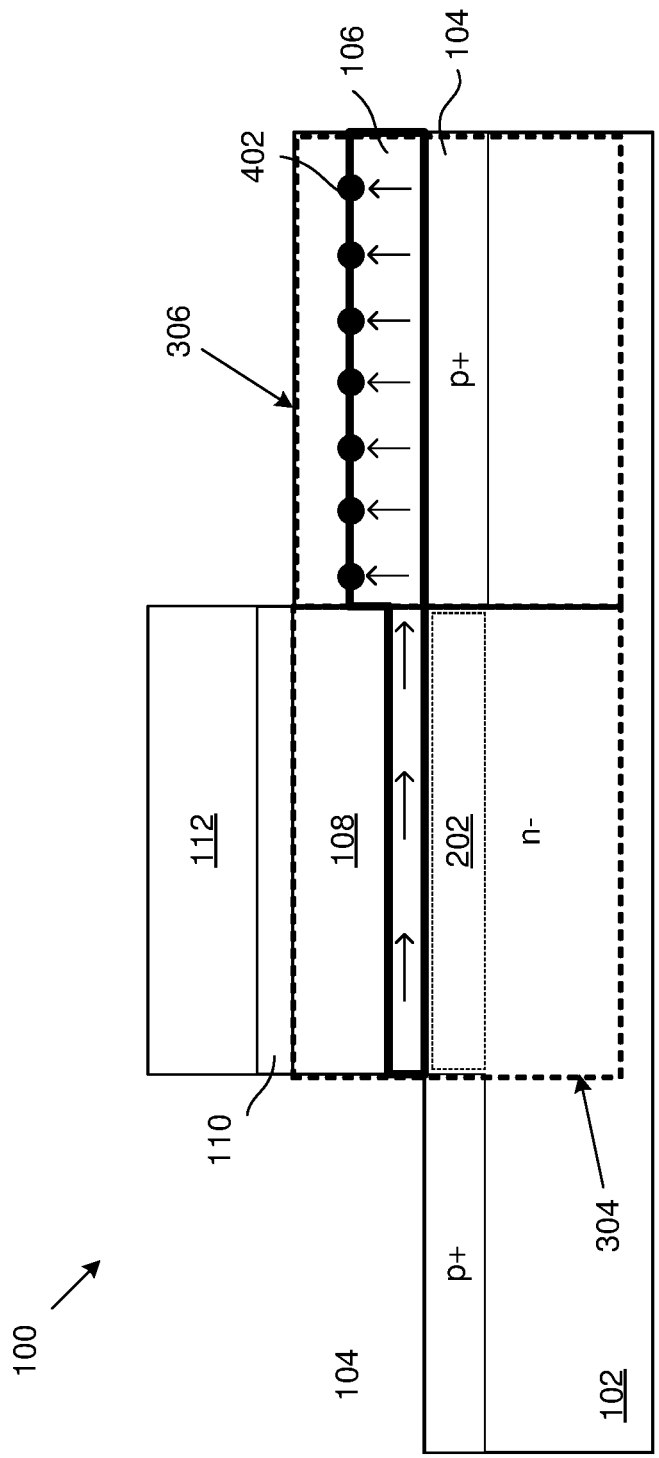
FIG. 4 is a cross-sectional view of a floating gate semiconductor device depicting a charge retention region including a plurality of nanostructures, according to an embodiment of the present disclosure.

Referring now to FIG. 4, a cross-sectional view of the semiconductor device 100 including a plurality of nanostructures 402 is shown, according to an embodiment of the present disclosure. The plurality of nanostructures 402 (hereinafter "nanostructures") may be formed in the charge retention region 306 of the floating gate 108 to further enhance charge retention time in the semiconductor device 100. More specifically, the nanostructures 402 may be formed on a top surface of the thick region 206 (FIG. 2) of the tunneling dielectric layer 106 by any method known in the art.

In one embodiment, the nanostructures 402 may include metal nanocrystals grown using techniques known in the art such as, for example, solution processing.

In another embodiment, the nanostructures 402 may include metal or semiconductor nanoparticles or nano-dots. More specifically, the nanostructure 402 may include metal nanoparticles deposited by thermal or electron beam flash evaporation.

In some cases, flash evaporation of gold may be performed in a vacuum chamber while a shutter is opened only for a short period of time to allow gold deposition on a sample. Such short deposition times may result in nano-dot formation on the surface rather than a continuous layer of gold. In one example, an evaporation rate of 1 Å/sec and an evaporation time (the period the shutter is open) of 5 sec may be used. In another example, an evaporation rate of 0.1 Å/sec and an evaporation time of 50 sec may be used. In yet another example, an evaporation rate of 1 Å/sec and an evaporation time of 10 sec may be used. The evaporation rate and time may be chosen such that the product of the evaporation time and evaporation rate is preferably lower than 2 nm and more preferably lower than 1 nm.

In other cases, semiconductor nano-dots may be formed using chemical vapor deposition or vapor phase epitaxy. The semiconductor nano-dots may be preferably formed from materials having a lower bandgap than that of the floating gate 108. For example, when the floating gate 108 is made of Si or SiGe, the nano-dots may be include Ge, InSb or InAs.

In other cases, a thin continuous semiconductor layer which may be amorphous or polycrystalline is deposited using techniques known in the art (e.g. evaporation, sputtering, CVD, etc.) and then converted into to nano-dots by melting and self-organized agglomeration, using a laser beam.

Moreover, in some embodiments the nanostructures 402 may include nanowires perpendicular to the direction of the floating gate 108 from the P/E region 304 to the charge retention region 306, or structural defects.

Figure 5:
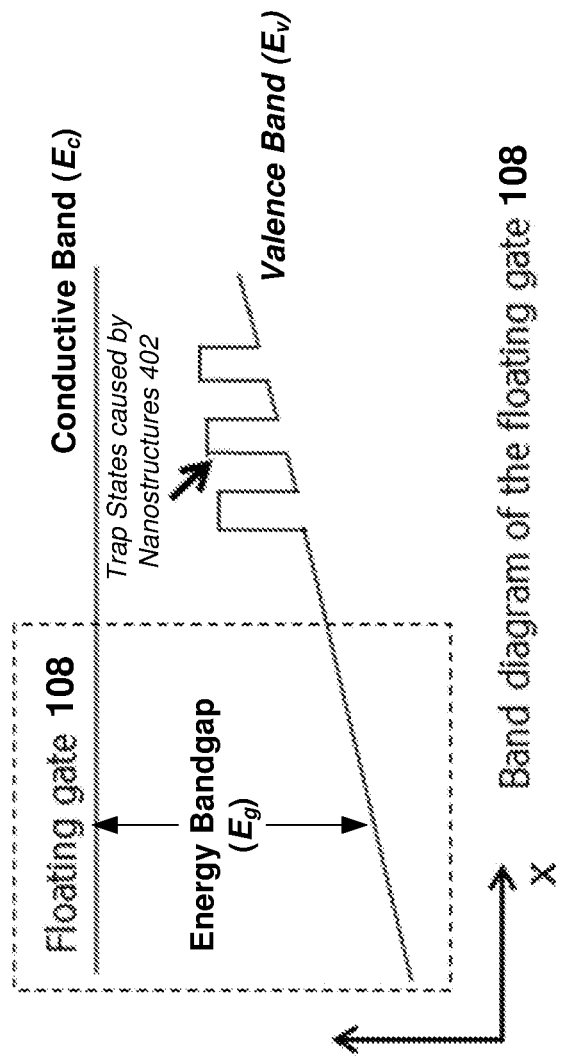
FIG. 5 is an exemplary band diagram of a floating gate on a semiconductor device including a plurality of nanostructures, according to an embodiment of the present disclosure.

The nanostructures 402 may create one or more electronic trap states (hereinafter "trap states") within the bandgap ($E_g$) of the floating gate 108 (as shown in FIG. 5) capable of retaining charge carriers. Preferably the trap states are close to the middle of the bandgap, as depicted in FIG. 5, in order to facilitate efficient charge trapping in the charge retention region 306.

With continued reference to FIG. 4, the tapered bandgap in the charge retention region 306 of the floating gate 108 may create a built-in electric field that aids in drifting of the injected carriers from the P/E region 304 towards the nanostructures 402, as described in FIG. 3. More specifically, charge carriers travelling from the P/E region 304 may fill the electronic trap state(s) shown in FIG. 5 associated with the nanostructures 402 in an orderly fashion, such that the electronic trap state(s) associated with a first nanostructure 402 (e.g., the leftmost nanostructure 402) is filled first, followed by the electronic trap state(s) associated with a second nanostructure 402, and so on. In embodiments in which the semiconductor device 100 is a FinFET device, there may be at least one nanostructure 402 disposed above each of the fins of the FinFET device.

Figure 6A:
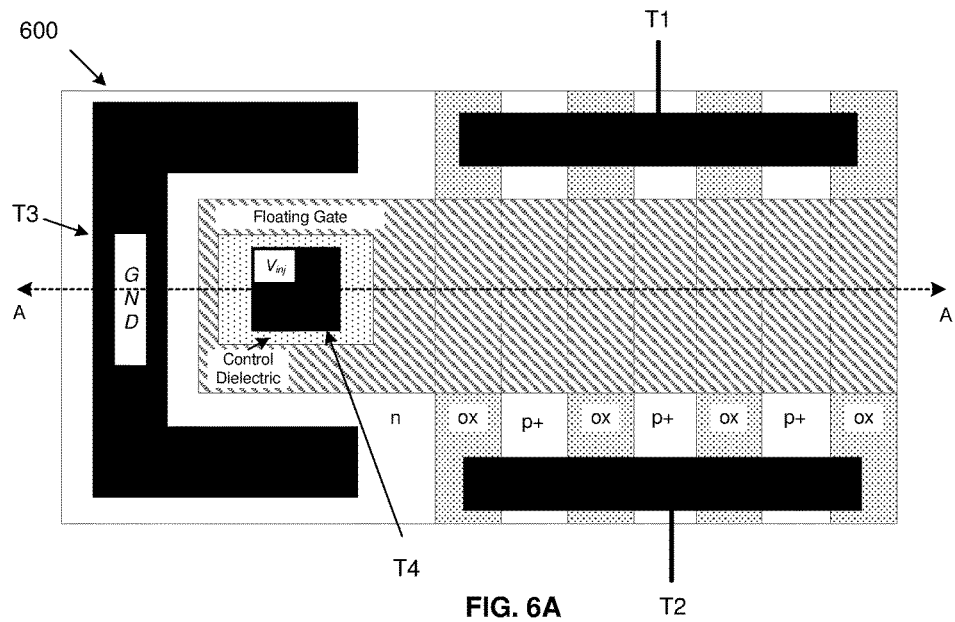
FIG. 6A is a top view of an exemplary four-terminal p-type FinFET device having decoupled program/erase and charge retention mechanisms, according to an embodiment of the present disclosure.
Figure 6B:
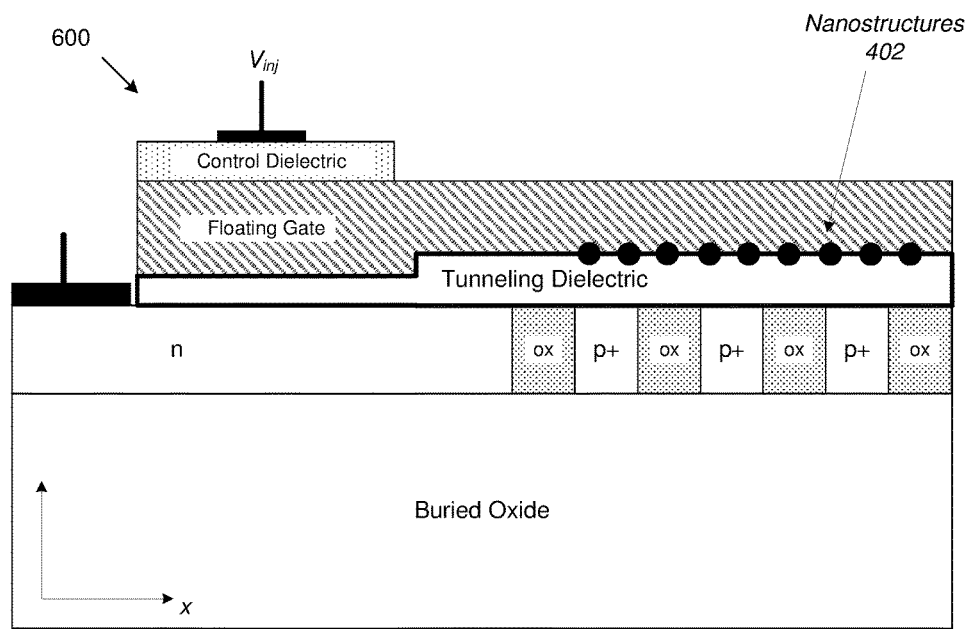
FIG. 6B is a cross-sectional view of FIG. 6A taken along section line A-A, according to an embodiment of the present disclosure.

Referring now to FIGS. 6A-6B, top and cross-sectional views of a semiconductor device 600 are shown, according to an embodiment of the present disclosure. In this embodiment the semiconductor device 600 is an exemplary four-terminal p-type FinFET device. In this embodiment, FIG. 6A is a top view of the semiconductor device 600 and FIG. 6B is a cross-sectional view of FIG. 6A taken along section line A-A.

In this embodiment, P/E and charge retention mechanisms of the semiconductor device 600 have been decoupled and charge retention time has been improved using the method described above with reference to FIGS. 1-5. The semiconductor device 600 may be formed using techniques well known in the art.

In this embodiment, $V_{inj}$ is the voltage applied to a control gate, a terminal T3 may be grounded and have substantially the same function as a source of a two-terminal NVM device, such as the semiconductor device 100 depicted in FIG. 4. Terminals T1 and T2 may be analogous to the source-drain region of a conventional two-terminal FinFET device. A multi-state resistance change may be measured between terminals T1 and T2 (FIG. 6A). It should be noted that in embodiments in which the semiconductor device 600 is a bulk device, it may include another terminal for body contact. Additionally, in embodiments in which the semiconductor device 600 is a SOI device, it may include a back gate contact for adjusting the threshold voltage or grounding electrostatic charge as known in the art.

It should be noted that in the absence of a trapped charge in the electronic trap states associated with the nanostructures 402, p+ fins connected between two device terminals (e.g. terminals T1 and T2 depicted in FIG. 6A) are typically conductive, but the trapping of charge carriers (e.g., holes) in the electronic trap states associated with the nanostructures 402 disposed on top of a fin may fully deplete that fin (due to the field effect of the trapped charge) and in consequence substantially reduce the conductivity of that fin. Therefore, since the overall conductivity between the two device terminals (e.g., T1, T2) is the sum of that of each individual fin, turning off the p+ fins may reduce the overall conductivity. As such, since the number of p+ fins is discrete, a multi-level memory function may be achieved such that the number of memory levels is substantially equal to the number of p+ fins.

Therefore, by forming a tunneling dielectric layer on a semiconductor substrate including a substantially thin region located directly above the channel region of the semiconductor device and a thicker region located directly above the source-drain regions, spatial decouple of the P/E and charge retention mechanisms may be achieve in a floating gate semiconductor device. Additionally, to further improve charge retention time in the floating gate, bandgap engineering may be used to increase a bandgap difference between the floating and the tunneling dielectric layer in a continuous fashion such that movement of charge carriers from the P/E region to the charge retention region of the floating gate increases. Moreover, the formation of a plurality of nanostructures in the thicker region of the tunneling dielectric layer may be added to bandgap engineering of the floating gate to further improve charge retention times in the charge retention region of the floating gate. As such, a faster P/E cycle may be achieve in the P/E region including the thin tunneling dielectric layer while charge retention time is improved in the charge retention region including the thicker tunneling dielectric layer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a semiconductor substrate comprising a source-drain region on opposite sides of a channel region;
a first dielectric layer above and in direct contact with the source-drain region and the channel region;
a second dielectric layer above and in direct contact with only a portion of the first dielectric layer in direct contact with the source-drain region,
wherein a portion of the first dielectric layer in direct contact with the channel region comprises a thin region, and the second dielectric layer above the first dielectric layer and the source-drain region comprises a thick region;
a floating gate above and in direct contact with the thin region and the thick region, wherein the floating gate comprises implanted elements having an energy bandgap lower than that of the floating gate in a continuous gradient such that an energy band gap of the floating gate is reduced in a tapered fashion along a longitudinal direction parallel to the channel region; and
a control dielectric layer directly above the floating gate.

2. The semiconductor structure of claim 1, further comprising:
a control gate directly above the control dielectric layer.

3. The semiconductor structure of claim 1, wherein a portion of the floating gate above and in direct contact with the thin region comprises a program/erase region of the floating gate.

4. The semiconductor structure of claim 1, wherein another portion of the floating gate above and in direct contact with the thick region comprises a charge retention region of the floating gate.

5. The semiconductor structure of claim 1, wherein a bandgap difference between the floating gate and the thin region and the floating gate and the thick region increases continuously in the longitudinal direction parallel to the channel region from the thin region to the thick region,
wherein the bandgap difference increases charge carriers movement from the thin region to the thick region.

6. The semiconductor structure of claim 1, wherein the thin region has a thickness varying from approximately 1 nm to approximately 5 nm.

7. The semiconductor structure of claim 1, wherein the thick region has a thickness varying from approximately 6 nm to approximately 20 nm.

8. The semiconductor structure of claim 1, wherein the second dielectric layer comprises a lower density and higher structural defects than the first dielectric layer.

9. A semiconductor structure comprising:
a semiconductor substrate comprising a source-drain region on opposite sides of a channel region;
a first dielectric layer above and in direct contact with the source-drain region and the channel region;
a second dielectric layer above and in direct contact with only a portion of the first dielectric layer in direct contact with the source-drain region,
wherein a portion of the first dielectric layer in direct contact with the channel region comprises a thin region and the second dielectric layer above the first dielectric layer and the source-drain region comprises a thick region; and
a floating gate above and in direct contact with the thin region and the thick region, wherein the floating gate comprises implanted elements having an energy bandgap lower than that of the floating gate in a continuous gradient such that an energy band gap of the floating gate is reduced in a tapered fashion along a longitudinal direction parallel to the channel region.

10. The semiconductor structure of claim 9, further comprising:
a control dielectric layer directly above the floating gate; and
a control gate directly above the control dielectric layer.

11. The semiconductor structure of claim 9, wherein a portion of the floating gate above and in direct contact with the thin region comprises a program/erase region of the floating gate.

12. The semiconductor structure of claim 9, wherein another portion of the floating gate above and in direct contact with the thick region comprises a charge retention region of the floating gate.

13. The semiconductor structure of claim 9, wherein a bandgap difference between the floating gate and the thin region and the floating gate and the thick region increases continuously in the longitudinal direction parallel to the channel region from the thin region to the thick region,
wherein the bandgap difference increases charge carriers movement from the thin region to the thick region.

14. The semiconductor structure of claim 9, wherein the second dielectric layer comprises a lower density and higher structural defects than the first dielectric layer.

15. The semiconductor structure of claim 9, wherein the thin region has a thickness varying from approximately 1 nm to approximately 5 nm.

16. The semiconductor structure of claim 9, wherein the thick region has a thickness varying from approximately 6 nm to approximately 20 nm.

17. A semiconductor structure comprising:
a semiconductor substrate comprising a source-drain region on opposite sides of a channel region;
a first dielectric layer above and in direct contact with the source-drain region and the channel region;
a second dielectric layer above and in direct contact with only a portion of the first dielectric layer in direct contact with the source-drain region,
wherein a portion of the first dielectric layer in direct contact with the channel region comprises a thin region, and the second dielectric layer above the first dielectric layer and the source-drain region comprises a thick region;
a floating gate above and in direct contact with the thin region and the thick region, wherein the floating gate comprises implanted elements having an energy bandgap lower than that of the floating gate in a continuous gradient such that an energy band gap of the floating gate is reduced in a tapered fashion along a longitudinal direction parallel to the channel region,
wherein a bandgap difference between the floating gate and the thin region and the floating gate and the thick region increases continuously in the longitudinal direction parallel to the channel region from the thin region to the thick region such that charge carriers movement increases from the thin region to the thick region; and
a control dielectric layer directly above the floating gate.

18. The semiconductor structure of claim 17, wherein a portion of the floating gate above and in direct contact with the thin region comprises a program/erase region of the floating gate.

19. The semiconductor structure of claim 17, wherein another portion of the floating gate above and in direct contact with the thick region comprises a charge retention region of the floating gate.

20. The semiconductor structure of claim 17, wherein the second dielectric layer comprises a lower density and higher structural defects than the first dielectric layer.

* * * * *